(12) United States Patent
Singh et al.

(10) Patent No.: US 7,401,280 B1
(45) Date of Patent: *Jul. 15, 2008

(54) SELF-VERIFICATION OF CONFIGURATION MEMORY IN PROGRAMMABLE LOGIC DEVICES

(75) Inventors: Satwant Singh, Fremont, CA (US); Chi Nguyen, San Jose, CA (US); Ann Wu, San Jose, CA (US); Ting Yew, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/750,790

(22) Filed: May 18, 2007

Related U.S. Application Data

(63) Continuation of application No. 11/036,630, filed on Jan. 13, 2005, now Pat. No. 7,257,750.

(51) Int. Cl.
*G01R 31/28* (2006.01)
*G06F 11/00* (2006.01)

(52) U.S. Cl. .................................. 714/732; 714/736
(58) Field of Classification Search ............... None
See application file for complete search history.

(56) References Cited

U.S. PATENT DOCUMENTS

| 4,441,074 A | * | 4/1984 | Bockett-Pugh et al. ....... 714/732 |
| 6,158,033 A | * | 12/2000 | Wagner et al. ............... 714/726 |
| 2005/0071730 A1 | * | 3/2005 | Moyer et al. ................. 714/758 |

* cited by examiner

*Primary Examiner*—Christine T Tu

(57) ABSTRACT

In one embodiment, a programmable logic device is provided that includes a memory having memory cells, each memory cell operable to store either a configuration bit or a RAM bit; a masking circuit operable to mask a RAM bit by providing a masking value for the masked RAM bit; an error detection circuit operable to process the configuration bits during operation of the programmable logic device using an error detection algorithm, the error detection circuit calculating a signature that includes configuration bits and masking values; and a comparator operable to compare the signature calculated by the error detection circuit with a correct signature.

20 Claims, 3 Drawing Sheets

SELF-VERIFICATION OF CONFIGURATION MEMORY IN PROGRAMMABLE LOGIC DEVICES

RELATED APPLICATION DATA

This application is a continuation of U.S. application Ser. No. 11/036,630, filed Jan. 13, 2005.

TECHNICAL FIELD

The present invention relates generally to programmable logic device reliability, and more particularly to a programmable logic device configured to verify its configuration memory during operation of the device.

BACKGROUND

A user may configure a programmable logic device (PLD) such as a field programmable gate array (FPGA) or complex programmable logic device (CPLD) to perform a desired function and thus avoid having to design an application specific integrated circuit (ASIC) to perform the same task. Because designs and system requirements may change and evolve, users of programmable logic devices can simply reprogram these devices without having to engineer another ASIC. Although programmable logic devices thus offer users significant advantages, a concern may be raised concerning their reliability. Specifically, the configuration of programmable logic devices often depends upon a volatile configuration memory such as SRAM that may become corrupted. Should a configuration bit in the configuration memory change its value, a programmable logic device may cease to perform the function desired by a user. In critical applications, such a failure could be disastrous.

Volatile configuration memory may become corrupted in a number of ways. For example, all materials, including the semiconductor substrate used to form a configuration memory, are naturally radioactive. Although this natural level of radioactivity is quite low, it still involves the emission of alpha particles. These high-energy particles may then interact with a memory cell and corrupt its value. Alternatively, power brownout, i.e., a glitch or drop in supply voltages over a certain duration, may corrupt the programmed value of the memory cells. Cosmic rays also generate charged particles that may corrupt the programmed values. Because all these sources of memory error do not relate to internal hardware flaws in the memory cells but rather to external effects that cause errors, they may be denoted as sources of soft error.

In the current state of the art, a programmable logic device user may verify configuration memory contents during the configuration process. For modern programmable logic devices, the configuration RAM can be quite large. To retrieve the contents of such a large memory, which may be several million bits or larger, and directly compare the retrieved bits to what was originally written would be quite complex. Thus, compression schemes such as cyclic redundancy check (CRC) have been employed to represent the combined state of the configuration RAM using a relatively small signature. Retrieving the signature and comparing the retrieved signature to that for the originally written bits is thus a less onerous task than a direct comparison. In a conventional programmable logic device, however, a user then has no way to re-verify the configuration memory contents during subsequent operation of the programmable logic device (i.e., while the device is operable to accept input data and generate output data). This inability to detect soft error during operation exists despite the aggravation of soft error probability as programmable logic device geometries continue to shrink.

Accordingly, there is a need in the art for programmable logic devices configured to allow the verification of the configuration memory during programmable logic device operation.

SUMMARY

One aspect of the invention relates to a programmable logic device including: a memory having memory cells, each memory cell operable to store either a configuration bit or a RAM bit; a masking circuit operable to mask a RAM bit by providing a masking value for the masked RAM bit; a signature calculation engine operable to process the configuration bits during operation of the programmable logic device using an error detection algorithm, the signature calculation engine calculating during a calculation cycle a signature that includes configuration bits and masking values; and a comparator operable to compare the signature calculated by the signature calculation engine in a given calculation cycle with a correct signature.

Another aspect of the invention relates to a programmable logic device, comprising: a memory having memory cells, each memory cell operable to store either a configuration bit or a RAM bit; a masking circuit operable to mask a RAM bit by providing a masking value for the masked RAM bit; an error detection circuit operable to process the configuration bits during operation of the programmable logic device using an error detection algorithm, the error detection circuit calculating a signature that includes configuration bits and masking values; and a comparator operable to compare the signature calculated by the error detection circuit with a correct signature.

Another aspect of the invention relates to a method for detecting errors in bits stored in a programmable logic device, comprising: determining whether a stored bit is a configuration bit or a RAM bit; masking the bit if it is determined to be a RAM bit by providing a masking value for the masked RAM bit; calculating a signature that includes the configuration bits and the masking values; comparing the signature with a correct signature.

BRIEF DESCRIPTION OF THE DRAWINGS

Use of the same reference symbols in different figures indicates similar or identical items.

DETAILED DESCRIPTION

The present invention provides a programmable logic device that may verify the contents of its configuration memory during normal operation. To enable this verification, a conventional programmable logic device may be modified with hardware dedicated to the self-verification task. Alternatively, a conventional programmable logic device may be programmed to perform this verification without the use of dedicated hardware in what may be denoted as an "IP-based" approach. The following description is of a hardware-based embodiment that performs the configuration memory verification. However, those of ordinary skill will appreciate that programmable logic devices themselves could be configured to perform the same tasks without additional hardware.

Figure 1:
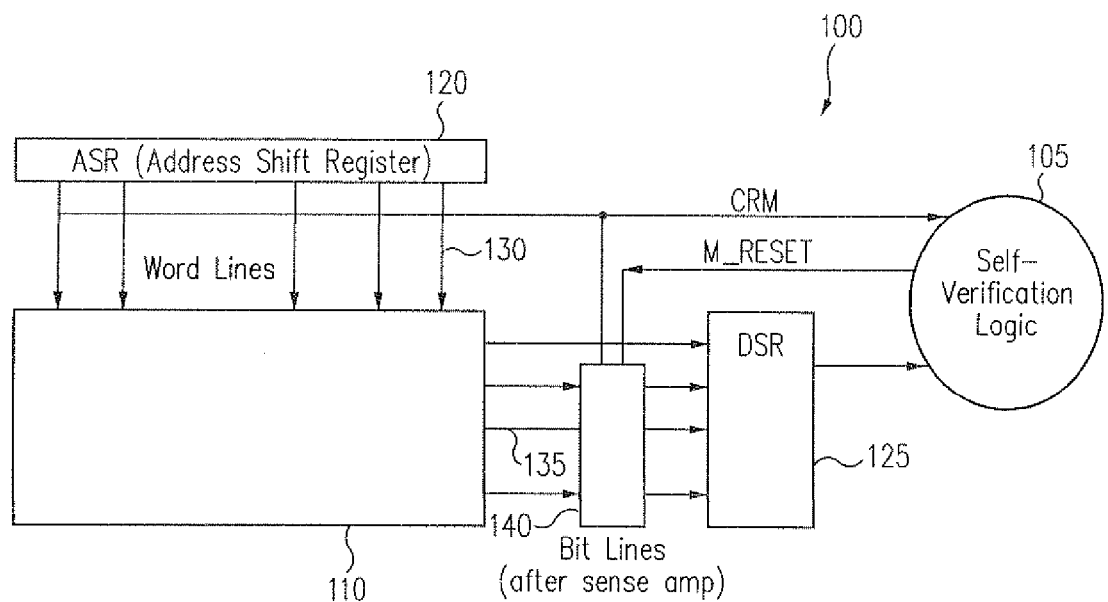
FIG. 1 is a block diagram overview of configuration memory self-verification system according to one embodiment of the invention.

Turning now to the figures, an exemplary embodiment of a programmable logic device (PLD) 100 having an error detection circuit such as self-verification logic 105 is shown in FIG. 1. Self-verification logic 105 executes an algorithm to verify the contents of a configuration memory 110. Any suitable error detection algorithm may be used within PLD 100 to perform the self-verification of the configuration data, such as an algorithm that derives values from the configuration data. Preferably, self-verification logic 105 uses the same algorithm used by an external programming tool that verifies the configuration data during the configuration process. For example, PLD 100 and the programming tool may each use an identical algorithm that calculates an error-checking signature for the configuration data for comparison with a correct signature. As is known in the error detection arts, an error-checking signature is a number that depends upon the data being examined. Should the contents of the data being error detected change, the signature should also change. However, depending upon how robust the particular error detection algorithm being implemented is, the signature may not change even though the data has become corrupted. For example, a simple parity bit signature will not detect an error should just two bits in the original data change polarity. This type of undetected error condition may be denoted as aliasing. More sophisticated error detection algorithms will generate a signature such as a checksum that will change its value with high probability if the data has become corrupted. For example, a variety of cyclic redundancy check (CRC) algorithms will generate signatures (often denoted as CRC checksums or a frame check sequences (FCSs)) that are robust to aliasing. Accordingly, the following discussion will assume that self-verification logic 105 is implemented as CRC check logic 105. However, it will be appreciated that other types of error detection circuits, algorithms, and techniques may be used, e.g., parity checks, or linear feedback shift register techniques.

As is known in the art, an external programming tool uses an address shift register 120 and a data shift register 125 to program the configuration memory 110 during the configuration process. The external programming tool supplies the configuration memory as data that is shifted through data shift register 125 and then written to addresses within configuration memory 110 as supplied by address shift register 120. Programmable logic device 100 exploits this configuration architecture to assist in the self-verification process performed by CRC check logic 105 in the following fashion.

Configuration memory 110 is arranged according to word and bit lines as is conventional in the memory arts. Configuration memory 110 is arranged to store a certain number of words, each word corresponding to a word line 130. Each word has the same width, corresponding to the number of bits. Each bit in a word corresponds to a bit line 135. Subsequent to configuration and during normal operation of programmable logic device 100, address shift register 120 will periodically cycle through word lines 130, successively activating one at a time. Upon activation of a word line 130, the bits in the corresponding word are read through, for example, a sense amp (not illustrated) and then registered in data shift register 125. In turn, the contents of data shift register 125 may be shifted through CRC check logic 105. After all bits within configuration memory 110 have been processed, CRC check logic 105 may compare the resulting CRC signature to that originally calculated during configuration to determine whether a soft error has occurred.

The verification of configuration memory should account for those configuration memory cells that may be used as RAM during normal operation. For example, programmable logic devices such as field programmable gate arrays (FPGAs) include lookup table (LUT)-based logic blocks whose truth tables are stored in the configuration memory. However, the majority of logical functions that a user configures an FPGA to implement will not require the programming of the truth tables for each and every logic block it contains. Typically, each logic block will contain one or more 16-bit LUTs. If not being used to store a truth table, the corresponding LUT configuration memory may function as one or more 16-bit RAMs or ROMS. But should these configuration memory cells be used as RAM, they necessarily may change their contents during operation of the programmable logic device. The change in content for the memory cells of a RAM is normal. However, if configuration memory cells used as RAM are included during the determination of the initial CRC signature, an error will be erroneously detected should the CRC signature be re-calculated upon revision of the RAM memory contents. The same erroneous detection of a soft error will occur if portion(s) of the configuration memory are dedicated as embedded memory and used as RAM during operation. In one embodiment, the present invention prevents this erroneous detection of a soft error during the verification of configuration memory using RAM detection circuit 140.

Figure 2:
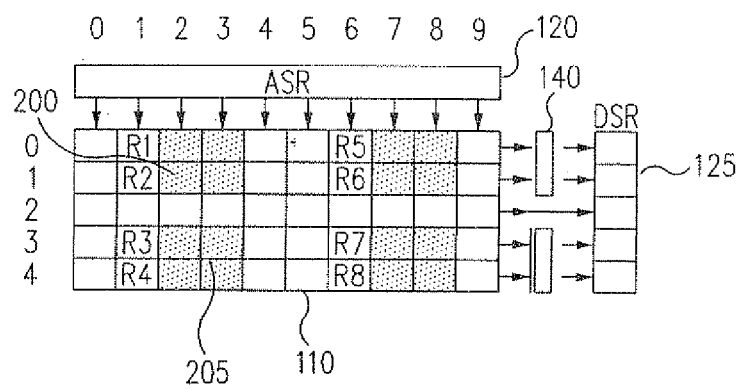
FIG. 2 illustrates the relationship between a configuration memory architecture and the address and data shift registers shown in FIG. 1 according to an embodiment of the invention.

Ram detection circuit 140 need only couple to those bit lines 135 that may carry RAM data. If a bit line 135 couples only to configuration memory cells that may be used only as ROM, processing such a bit line through RAM detection circuit 140 would be superfluous. The arrangement of RAM detection circuit 140 with respect to bit lines 135 thus depends upon the architecture of configuration memory 110. For example, an exemplary configuration memory architecture for configuration memory 110 in an embodiment in which programmable logic device 100 comprises an FPGA is shown in FIG. 2. In this embodiment, the FPGA has four LUTs (complete structure not illustrated) whose configuration memory cells may be used as RAM. The RAM configuration memory cells for a given LUT may be grouped together on adjacent word and bit lines. For example, a first LUT group 200 of RAM configuration memory cells exists at intersection of bit lines 0 and 1 with word lines 2 and 3. A second group 205 of RAM configuration memory cells resides at the intersection of bit lines 3 and 4 with word lines 2 and 3. Other groups lie at the intersection of word lines 7 and 8 with bit lines 0,1, 3, and 4. Because bit line 2 does not couple to any RAM cells, it need not be processed by RAM detection circuit 140.

As illustrated, each LUT group is just four bits although it will be appreciated that sixteen bits is conventional—four being used merely for illustration clarity. At least one configuration memory cell will need to store a signal indicating whether a given LUT's memory cells are being configured as RAM rather than to store the LUT's truth table. The configuration memory cells that store such signals are denoted herein as RAM flag cells. Although just one RAM flag cell could be used to indicate whether the corresponding LUT configuration memory cells are being configured as RAM, two such cells are used for each LUT group in memory 110. For example, RAM flag cells R1 and R2 correspond to group 200, R3 and R4 to group 205, R5 and R6 to another group, and R7 and R8 to another group. Should either RAM flag cell for a LUT group store the "RAM" binary signal, the corresponding configuration memory cells are configured as RAM. The binary signal will be assumed to be a logical "1" without loss of generality. Although the RAM flag memory cell corresponding to a particular LUT configuration memory group may be arbitrarily located in configuration memory 110, it will be assumed for illustration purposes that the RAM flag memory cells will be located on word lines immediately preceding the LUT configuration memory groups. For example, RAM flag cells R1 and R2 are located at the intersection of word line 1 with bit lines 0 and 1. The corresponding LUT configuration memory cells follow on word lines 2 and 3 in the same bit line locations. Similarly, RAM flag cells R5 and R6 are located at the intersection of word line 6 with bit lines 0 and 1. The corresponding LUT configuration memory cells follow on word lines 7 and 8 in the same bit line locations. The word lines coupling to RAM flag cells such as word lines 1 and 6 may be denoted as RAM flag word lines.

Figure 3:
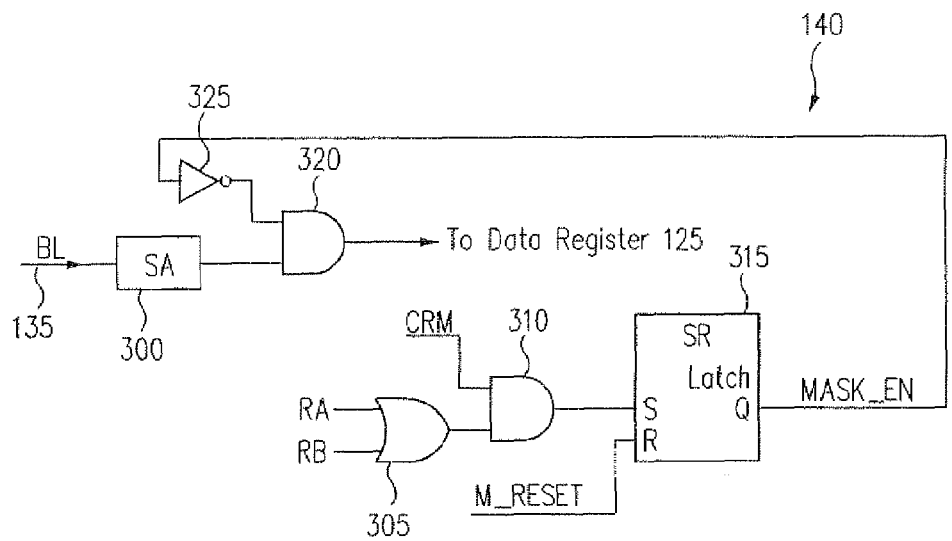
FIG. 3 is a circuit diagram for a configuration RAM masking circuit according to an embodiment of the invention.

An exemplary embodiment of RAM detection circuit 140 is illustrated in FIG. 3. For this embodiment of configuration memory 110, word lines that couple to configuration memory cells configurable as RAM are preceded by a RAM flag word line as discussed previously. As discussed previously with regard to FIG. 4, address shift register 120 is configured to assert a check RAM mode (CRM) flag signal when the register activates a RAM flag word line such as word line 1. Each bit line 135 associates with a detection circuit such as a sense amp 300 for determining the bit content of the configuration memory cell being read. For example, sense amp 300 provides the R1 flag signal corresponding to RAM flag cell R1. The R1 flag signal will then be coupled to data shift register 125 for subsequent processing by CRC check logic 105 as discussed with respect to FIG. 1. At the subsequent reading of word line 2, it may be that sense amp 300 is reading a configuration memory cell value that has changed because it is being used as RAM. If so, such a value should be masked before processing by CRC check logic 105. To effect masking, sense amp 300 may couple its output to data shift register 125 through a masking circuit such as an AND gate 320. AND gate 320 also receives an inverted version of a masking signal MASK_EN as inverted by an inverter 325. Thus, should MASK_EN be asserted, AND gate 320 will couple a logical zero to data shift register 125 regardless of the value being read by sense amp 300, thereby effecting a mask of the RAM data.

The masking signal MASK_EN may be generated as follows. In an embodiment in which each LUT group associates with two RAM flag cells, the corresponding RAM flag signals may be denoted as $R_A$ and $R_B$. Thus, for LUT group 200, $R_A$ and $R_B$ correspond to the contents of RAM flag cells R1 and R2, respectively. Similarly, for LUT group 205, $R_A$ and $R_B$ correspond to the contents of RAM flag cells R3 and R4, and so on. Because either $R_A$ or $R_B$ may determine whether the corresponding group of LUT configuration memory cells are configured as RAM, both these signals are processed. For example, an OR gate 305 may receive both $R_A$ and $R_B$ and provide an output to an AND gate 310 that also receives flag signal CRM. Flag signal CRM is asserted because of the assertion of a RAM flag word line such as word line 1. Thus, should either $R_A$ or $R_B$ be asserted, the output of AND gate 310 will be asserted. This output is received by a SR latch 315 at its set input. In this fashion, when both CRM and either one of $R_A$ or $R_B$ is asserted, MASK_EN is also asserted because it is produced as the Q output of SR latch 315. Because of the operation of SR latch 315, MASK_EN will remain asserted by SR latch 315 until the latch is reset by the assertion of an M_RESET signal that SR latch 315 receives at its reset (R) input. The M_RESET signal may be generated by any suitable circuit such as address shift register 120 or CRC check logic 105. The assertion of M_RESET depends upon the number of consecutive word lines spanned by a particular LUT configuration memory group. With respect to the embodiment illustrated in FIG. 2, that number is two. Thus, the M_RESET signal is asserted, for example, upon reading word line 4.

Figure 4:
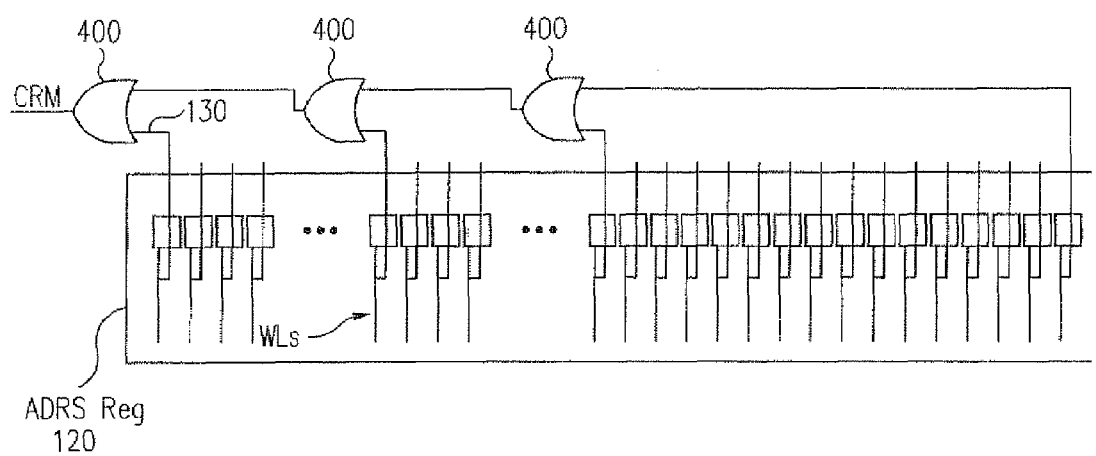
FIG. 4 is a circuit diagram for the generation of a configuration RAM flag signal according to an embodiment of the invention.

As seen in FIG. 4, the CRM signal may be generated by evaluating RAM flag word lines 130 through OR gates 400. As illustrated, multiple two-input OR gates 400 may be used. Alternatively, a single wide-input OR gate may receive these word line outputs and OR them together. However, the use of multiple 2-input OR gates 400 conserves die space. Because OR gates 400 perform the logical OR operation on the RAM flag word lines 130, should one of the word lines be asserted, the CRM signal will also be asserted. CRC check logic 105 may be configured with a counter (not illustrated) that responds to the successive activation of word lines coupling to RAM configuration memory cells and asserts M_RESET after these lines have been processed.

Figure 5:
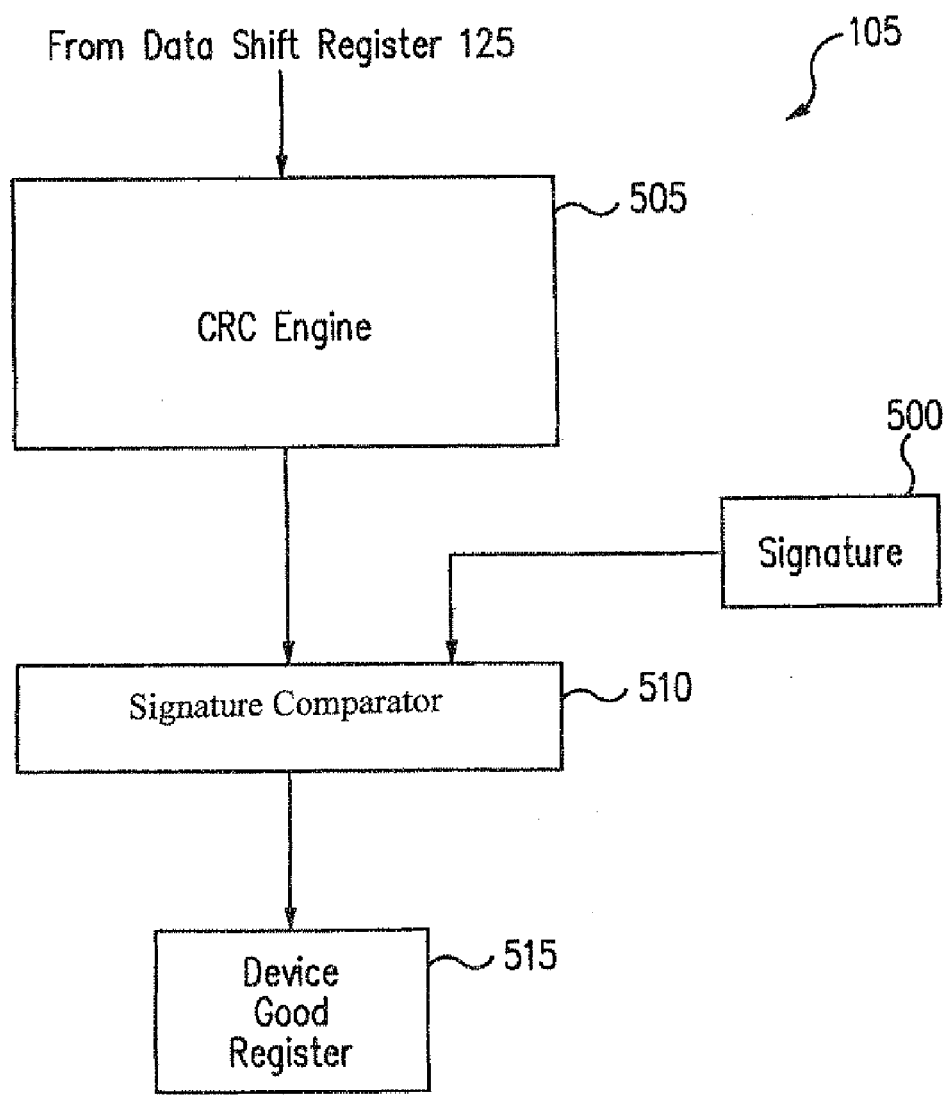
FIG. 5 is a block diagram of CRC check logic according to an embodiment of the invention.

RAM detection circuit 140 acts to mask the contents of RAM configuration memory cells. Because of the cyclic nature of CRC processing, it is most convenient to mask these cells by providing a predetermined value for these configuration memory cells such as the binary zero provided by AND gate 320 when MASK_EN has been asserted. During configuration of programmable logic device 100 by an external programming tool, the correct CRC signature is determined for the configuration memory data. Referring to FIG. 5, this correct CRC signature may be stored in a signature register 500 for processing by CRC check logic 105. Alternatively, the initial CRC signature determined by CRC check logic 105 may be registered in signature register 500 should an externally provided CRC signature be unavailable. CRC check logic 105 includes a signature calculation engine 505 for generating a current CRC signature from the configuration memory data. CRC check logic 105 may compare the current CRC signature to a correct signature stored in register 500 using a comparator 510. Based upon the comparison, comparator 510 provides a "device good" flag to a register 515. In addition, the device good flag may be distributed to external devices. Should the device good flag indicate an error in the configuration memory, programmable logic device 100 may be configured to re-configure the configuration memory 110 through communication with an external programming toot or by reading the configuration memory data from a non-volatile memory and writing to the configuration memory 110 accordingly.

The above-described embodiments of the present invention are merely meant to be illustrative and not limiting. It will thus be obvious to those skilled in the art that various changes and modifications may be made. For example, other error detection algorithms including but not limited to parity bit schemes may be used in lieu of a CRC signature calculation. In such embodiments, self-verification logic 105 and its signature calculation engine 505 would be of suitable design. The self-verification technique may be implemented by dedicated hardware or be partially or wholly IP-based for the evaluation of any configuration memory cell used as RAM regardless of whether the memory cell is used within an embedded memory or may function to store a LUT truth table value. Accordingly, the appended claims encompass all such changes and modifications as fall within the true spirit and scope of this invention.

We claim:

1. A programmable logic device, comprising:
   configuration memory having configuration memory cells that each can store a configuration bit or a RAM bit;
   a masking circuit operable to mask a RAM bit detected in a configuration memory cell;
   a signature calculation engine operable to calculate a signature that includes configuration bits and masked RAM bits stored in the configuration memory cells; and
   a comparator operable to compare the calculated signature with a correct signature.

2. The programmable logic device of claim 1, wherein the signature calculation engine is operable to calculate the signature during normal operation of the programmable logic device.

3. The programmable logic device of claim 1, wherein the comparator is operable to compare the calculated signature with the correct signature during normal operation of the programmable logic device.

4. The programmable logic device of claim 1 including a configurable logic core, wherein the signature calculation engine and the comparator are each configured within the logic core.

5. The programmable logic device of claim 1, wherein the signature calculation engine and the comparator each comprise dedicated hardware within the programmable logic device.

6. The programmable logic device of claim 1, wherein the signature calculation engine is a CRC calculation engine and the comparator is a CRC signature comparator.

7. The programmable logic device of claim 6, wherein the CRC calculation engine comprises a linear feedback shift register (LFSR).

8. The programmable logic device of claim 1, wherein the signature calculation engine is a parity bit calculation engine and the comparator is a parity bit comparator.

9. The programmable logic device of claim 1, wherein the signature calculation engine is operable to calculate an initial signature during an initial cycle, and the initial signature is stored in the programmable logic device as the correct signature.

10. The programmable logic device of claim 1, wherein the masking circuit is operable to mask a RAM bit by providing a predetermined value for the RAM bit to the signature calculation engine.

11. The programmable logic device of claim 1 including a detection circuit operable to detect whether a bit stored in a configuration memory cell is a configuration bit or a RAM bit.

12. The programmable logic device of claim 11, wherein the masking circuit comprises a logic circuit coupled between the configuration memory cells and the signature calculation engine, the logic circuit responsive to a mask enable signal generated by the detection circuit.

13. The programmable logic device of claim 11, wherein the configuration memory includes a RAM flag cell indicating whether a corresponding configuration memory cell is configured as RAM, and the detection circuit is operable to read the RAM flag cell.

14. The programmable logic device of claim 1 including embedded RAM, wherein the masking circuit is operable to mask a RAM bit detected in an embedded RAM cell, and the signature calculation engine is operable to calculate a signature that includes masked RAM bits stored in embedded RAM cells.

15. A programmable logic device, comprising:
    configuration memory having memory cells that can store a configuration bit or a RAM bit;
    a detection circuit operable to detect whether a bit stored in a configuration memory cell is a configuration bit or a RAM bit a masking circuit responsive to the detection circuit for masking a RAM bit detected in a configuration memory cell;
    a signature calculation engine operable to calculate a signature that includes configuration bits and masked RAM bits stored in the configuration memory cells; and
    a comparator operable to compare the calculated signature with a correct signature stored in the programmable logic device.

16. The programmable logic device of claim 15, wherein the signature calculation engine is operable to calculate the signature and the comparator is operable to compare the calculated signature with the correct signature during normal operation of the programmable logic device.

17. The programmable logic device of claim 15 including embedded RAM, wherein the masking circuit is operable to mask a RAM bit detected in an embedded RAM cell, and the signature calculation engine is operable to calculate a signature that includes masked RAM bits stored in embedded RAM cells.

18. A method for verifying the content of configuration memory of a programmable logic device, comprising:
    detecting whether a bit stored in a configuration memory cell is a configuration bit or a RAM bit;
    if the detected bit is a RAM bit, masking the RAM bit;
    calculating a signature that includes the configuration bits and the masked RAM bits; and
    comparing the calculated signature with a correct signature to verify the whether the content of the configuration memory is correct.

19. The method of claim 18, wherein the method is practiced during normal operation of the programmable logic device.

20. The method of claim 18, wherein the method is practiced entirely within the programmable logic device.

* * * * *

UNITED STATES PATENT AND TRADEMARK OFFICE
CERTIFICATE OF CORRECTION

PATENT NO. : 7,401,280 B1
APPLICATION NO. : 11/750790
DATED : July 15, 2008
INVENTOR(S) : Satwant Singh et al.

Page 1 of 1

It is certified that error appears in the above-identified patent and that said Letters Patent is hereby corrected as shown below:

Column 8, lines 12-25 should read as follows:

15. A programmable logic device, comprising:
   configuration memory having memory cells that can store a configuration bit or a RAM bit;
   a detection circuit operable to detect whether a bit stored in a configuration memory cell is a configuration bit or a RAM bit;
   a masking circuit responsive to the detection circuit for masking a RAM bit detected in a configuration memory cell;
   a signature calculation engine operable to calculate a signature that includes configuration bits and masked RAM bits stored in the configuration memory cells; and
   a comparator operable to compare the calculated signature with a correct signature stored in the programmable logic device.

Column 8, lines 37-46 should read as follows:

18. A method for verifying the content of configuration memory of a programmable logic device, comprising:
   detecting whether a bit stored in a configuration memory cell is a configuration bit or a RAM bit;
   if the detected bit is a RAM bit, masking the RAM bit;
   calculating a signature that includes the configuration bits and the masked RAM bits; and
   comparing the calculated signature with a correct signature to verify whether the content of the configuration memory is correct.

Signed and Sealed this

Twenty-fourth Day of February, 2009

JOHN DOLL
*Acting Director of the United States Patent and Trademark Office*